United States Patent [19]

Uchishiba et al.

[11] Patent Number: 4,568,618
[45] Date of Patent: Feb. 4, 1986

[54] MAGNETIC BUBBLE MEMORY CHIP

[75] Inventors: Hidema Uchishiba, Zushi; Seiichi Iwasa, Sagamihara; Kazuyuki Yamaguchi, Kawasaki, all of Japan

[73] Assignee: Fujitsu Limited, Kawasaki, Japan

[21] Appl. No.: 659,879

[22] Filed: Oct. 15, 1984

Related U.S. Application Data

[63] Continuation of Ser. No. 345,410, Feb. 3, 1982, abandoned.

[30] Foreign Application Priority Data

Feb. 4, 1981 [JP] Japan .................................. 56-15477

[51] Int. Cl.[4] .................................. G11B 5/64
[52] U.S. Cl. .................................. 428/693; 252/62.57; 365/33; 428/900; 428/910; 428/700; 428/702
[58] Field of Search .................. 428/692, 693, 900, 910, 428/700, 702; 252/62.57

[56] References Cited

U.S. PATENT DOCUMENTS 4,002,803  1/1977  Blank .................................. 428/900
4,165,410  8/1979  Blank .................................. 428/900
4,169,189  9/1979  Stacey ................................ 428/693
4,239,805  12/1980 Jonker ................................ 428/692
4,338,372  7/1982  Ohta .................................. 428/693

Primary Examiner—Ellis P. Robinson
Attorney, Agent, or Firm—Staas & Halsey

[57] ABSTRACT

In order for the temperature dependence of the strip out field of a magnetic garnet crystal film (54) to match the temperature dependence of the residual magnetization of a permanent magnet (56) for applying a bias magnetic field in a magnetic bubble memory chip (2) after conductor paterns are formed thereon, it is necessary that the temperature coefficient of the collapse field of the magnetic garnet crystal film (51) be from 0.01 to 0.04%/°C., in terms of an absolute value, greater than the temperature coefficient of the above-mentioned residual magnetization (56). The present invention achieves this by increasing the degree of substitution of Lu ions for Fe ions in the octahedral sites constituting the unit lattice of the magnetic garnet crystal. As a result, an operating temperature range about twice as wide as the conventional operating temperature range is ensured.

7 Claims, 14 Drawing Figures

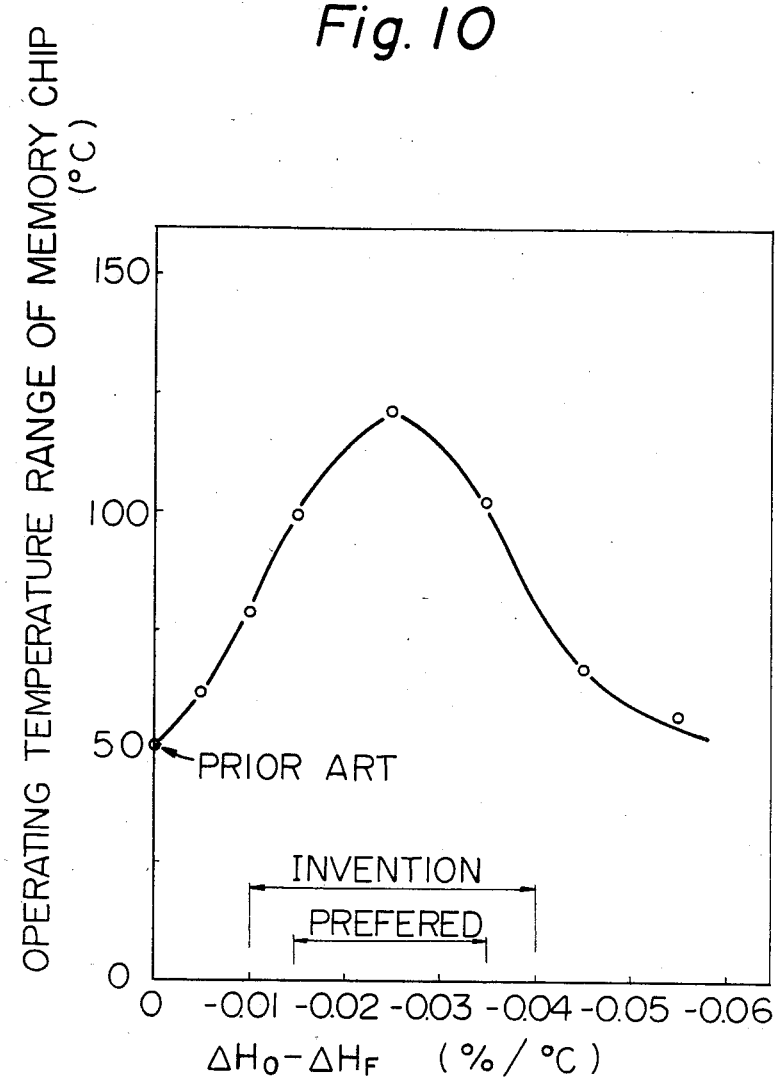

TETRAHEDRAL SITE  OCTAHEDRAL SITE

MAGNETIC BUBBLE MEMORY CHIP

This is a continuation of co-pending application Ser. No. 345,410 filed on Feb. 3, 1982 now abandoned.

BACKGROUND OF THE INVENTION

The present invention relates to a magnetic bubble memory chip comprising a magnetic garnet film on which a transfer circuit, a generator circuit, and a detector circuit for magnetic bubbles are provided, the magnetic garnet film being crystal-grown on a substrate consisting of a non-magnetic garnet single crystal by means of a liquid phase epitaxial growth method. More particularly, the present invention relates to a technique for adjusting the temperature coefficient of the collapse field of a magnetic garnet crystal film.

A prior art structure will be illustrated below, with reference to the accompanying drawings (FIGS. 1 through 3).

BRIEF DESCRIPTION OF THE DRAWINGS

In the drawings,

FIG. 10 is a graph illustrating an operating temperature range of a magnetic bubble memory chip;

A magnetic bubble memory device comprises a substrate of a magnetic garnet crystal film which is epitaxially grown on a non-magnetic garnet substrate, particularly a $Gd_3Ga_5O_{12}$ single crystal substrate, and a single crystal film is provided with transfer, generator, and detector circuits as well as means for retaining and transferring magnetic bubbles. The magnetic bubble memory device has generally a structure as shown in FIG. 1. As illustrated in FIG. 1, a general magnetic bubble memory device comprises a memory chip 2 mounted on an insulating base 1, an XY coil 3, thin plate magnets 4, ferrite yokes 5, pin terminals 6, and a shield case 7. The XY coil 3 applies a rotating magnetic field to the memory chip and effects, for example, transfer of magnetic bubbles. The thin plate magnets 4 and the ferrite yokes 5 apply a bias magnetic field to the memory chip 2 in order to stably retain the magnetic bubbles in the memory chip.

A general magnetic bubble memory device which uses a block brigade transfer system comprises two memory areas in order to decrease access time. In such a memory device, bubble signals corresponding to input data are divided into an even series and an odd series and are stored in the two memory areas, respectively.

Figure 2:
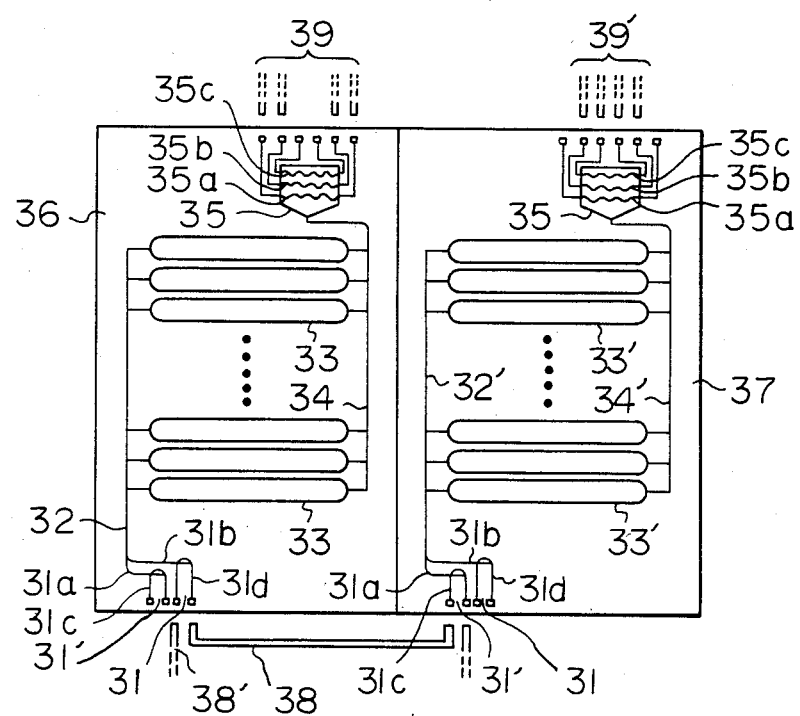
FIG. 2 is a conceptional view illustrating generator circuits and a propagating loop of a major-minor system of the conventional magnetic bubble memory device.

In FIG. 2, 31 and 31' are two bubble generators, each being composed of conductor patterns 31c and 31d and the end portions 31a and 31b of the write-in major line 32 which are formed on the conducting patterns 31c and 31d, respectively. In this case, the write-in major line 32 is composed, for example, of half disc-shaped Permalloy patterns. The circuit patterns 36 on the left side of FIG. 2 constitute an even block which stores even series of bubble signals, and the circuit patterns 37 on the right side of FIG. 2 constitute an odd block which memorizes odd series of bubble signals. One memory chip is composed of these two blocks 36 and 37.

In the memory device of FIG. 2, which uses a major-minor system, a large number of minor loops 33 and 33' are disposed and coupled to transfer patterns, i.e., major lines 32 and 32', respectively, at every two bits. When write-in of bubble signals is effected, the bubble signals are transmitted through the major lines 32 and 32' by driving a magnetic field applied from the XY coil. When magnetic bubbles of even orders of the bubble signals are transmitted to each bit position of the major line 32 corresponding to the positions of the minor loops 32 in the even block 36, magnetic bubbles of odd orders are transmitted to each bit position of the major line 32' corresponding to the positions of the minor loops 33' in the odd block 37.

In this condition, the bubbles on the major lines 32 and 32' are transferred to the corresponding minor loops 33 and 33' by the action of transfer gates, which are composed of conducting patterns and which are not shown in the drawing, thereby effecting write-in of information to the minor loops 33 and 33'.

In summary, the magnetic bubble memory device comprises a magnetic bubble memory chip held between permanent magnets each having the form of a plate, the memory chip comprising a magnetic single crystal film on which conductor patterns such as a magnetic bubble generator circuit and the like are film-formed from an electrically conductive material and patterns such as a transfer circuit and a detector circuit and the like are film-formed from a magnetic material having a high magnetic permeability, such as Permalloy. The permanent magnets apply a bias magnetic field to the memory chip in order to stably retain the magnetic bubbles in the memory chip while the X and Y driving coils apply a rotating magnetic field to the memory chip in parallel thereto. As a result, transfer of the magnetic bubbles is effected, whereby write-in and read-out of the information of the bubbles are carried out.

In such a memory chip, as the permanent magnet applying the bias magnetic field, there has been heretofore used Ba or Sr ferrite whose temperature dependence of residual magnetization is decreased with an increase in temperature similar to the manner in which the collapse field of the magnetic garnet crystal film is decreased with increase in temperature. On the other hand, the magnetic garnet crystal film to be epitaxially grown is designed so that the temperature coefficient of the collapse field matches the temperature coefficient of the residual magnetization of the permanent magnet. This is carried out by controlling the composition of the magnetic garnet, as is known from U.S. Pat. No. 4,002,803. This matching of both temperature coefficients aims at ensuring the operating range of the magnetic bubble memory device over a broad temperature range.

The magnetic garnet crystal film is spontaneously magnetized because of its strong unidirectional magnetic anisotropy normal to the plane of the film and has strip domains formed therein. When a bias magnetic field is applied to the magnetic garnet crystal film to the extent that the domains having an opposite direction of magnetization are reversed and diminished, a cylindrical bubble domain is produced. The magnetic bubble memory device uses the bubble domain as a memory medium.

The range of the bias field for which the bubble domain is present in the form of a cylinder is called the bias margin. When the magnetic field to be applied exceeds the upper magnetic field value of the bias margin, the magnetic bubble disappears, while when the magnetic field to be applied is less than the lower magnetic field of the bias margin, the magnetic bubble strips out so that stripe domains are formed.

Figure 3:
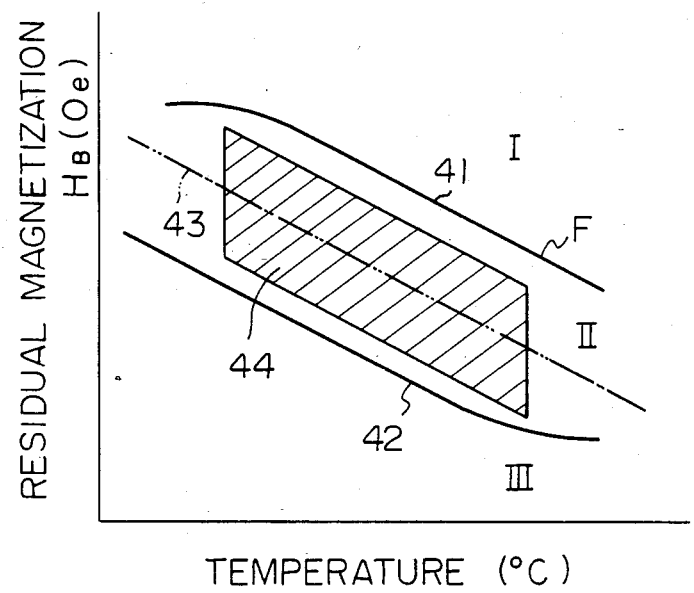
FIG. 3 is a view illustrating a temperature dependence of a bias margin of a conventional magnetic bubble memory chip.

FIG. 3 is a schematic view showing the temperature dependence of the bias margin at which the magnetic bubble memory operates. In FIG. 3, the abscissa indicates the temperature of the memory chip, while the ordinate indicates the bias field $H_B$. The curve 41 represents a boundary between the collapse region I and the bias margin II, while the curve 42 represents a boundary between the bias margin II and the strip out region III. The dot-dash line 43 drawn in the center of the bias margin II indicates the temperature dependence of the residual magnetization of the permanent magnet. The slashed parallelogram region 44 indicates a region in which the magnetic bubble memory normally operates without causing any erroneous operation.

As is apparent from FIG. 3, the bias margin II tends to shift to the lower bias field side as the temperature is increased. Therefore, a material whose residual magnetization exhibits the same temperature dependence as the bias margin is used as the permanent magnet applied to the bias field.

In accordance with the process described in U.S. Pat. No. 4,002,803, the variation in temperature of the bubble collapse field of a class of garnet magnetic bubble layer materials is selected by controlling octahedral site substitution during crystal growth so as to permit the growth of layers, whose temperature dependence regarding the bias margin more closely matches the temperature dependence of available bias magnet materials, resulting in an extended operating temperature range and/or wider operating margins.

Since it is difficult to match the temperature properties of the permanent magnet with those of the magnetic garnet crystal film by controlling the composition of the permanent magnet, it is practical to match these temperature coefficients by controlling the composition of the magnetic garnet crystal film.

The term "temperature coefficient" as used herein refers to a change in the percentage of the strip out field or the collapse field over a temperature of from $-20°$ to $100°$ C. which is normalized with respect to the magnetic field at a temperature of $0°$ C.

Figure 4:
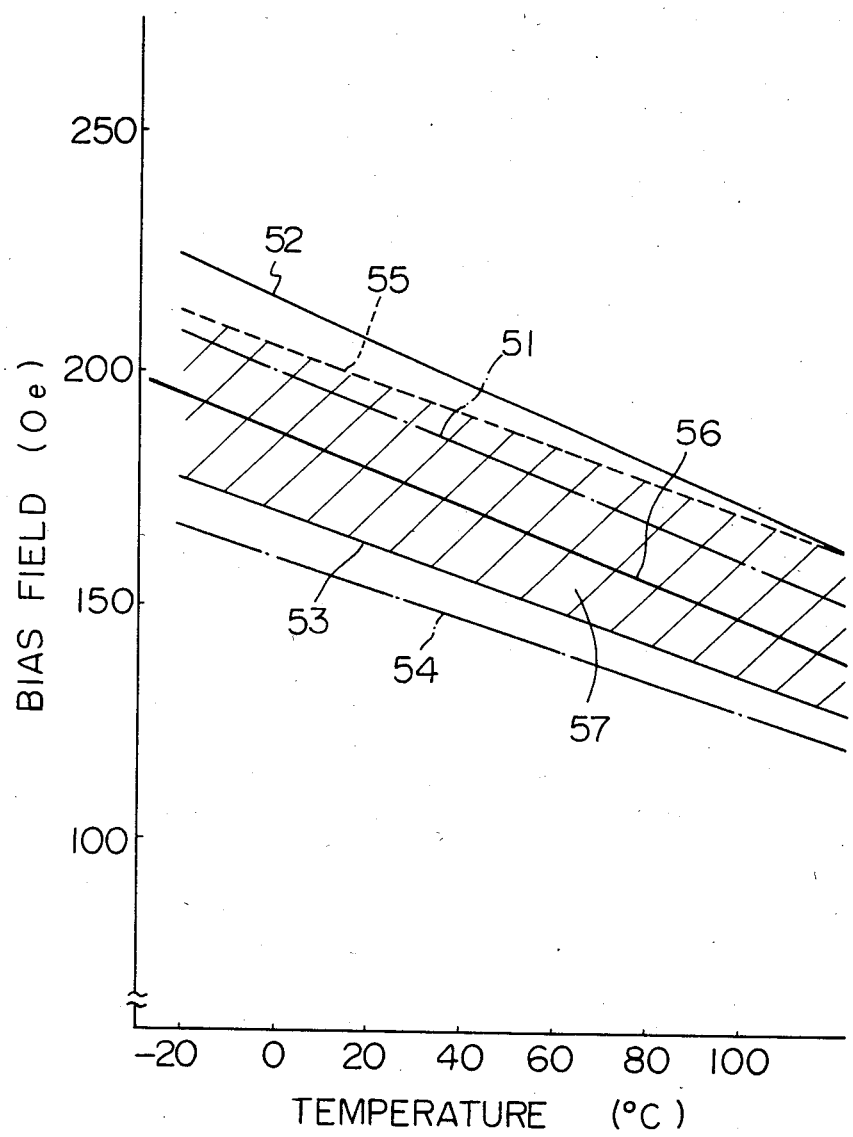
FIG. 4 is a conceptional graph illustrating a technique for adjusting the temperature coefficient of the collapse field of a magnetic garnet crystal film according to the present invention.

In FIG. 4, the dash-dotted line 51 indicates the temperature dependence of the collapse field $H_0$ (i.e. the collapse field before the formation of the propagation patterns) of the magnetic garnet crystal film in the case where the temperature coefficient is $-0.2\%/°C$. The solid line 52 indicates the magnetic field at which the magnetic bubble linearly propagating in the minor loop disappears. The temperature coefficient is $-0.2\%/°C$., which is the same as the above-mentioned garnet crystal film. However, because the actual field applied to the garnet crystal film is lower than the residual magnetization of the permanent magnet due to the formation of the Permalloy pattern, the absolute value is higher than that indicated by the dash-dotted line 51, i.e. the magnetic bubble does not disappear until a higher field is reached. The solid line 53 and the dash-dotted line 54 represent the lower limit of the bias margin. The lines 53 and 54 indicate the strip out field before and after the formation of the propagating patterns, respectively. In these cases, both of the temperature coefficients of the strip out field 53, 54 are $-0.20\%/°C$.

The bias margin after the formation of the propagating patterns therefore shifts to a higher bias magnetic field than that before the formation of the propagating patterns. In order to ensure that such operating parts as the detector and the replicator, of the memory chip operate normally, the magnetic bubble must propagate in a stretched state. In order to do this, it is necessary that the propagating patterns have a desired shape so as to equivalently shift the limiting strip out field of the section of the magnetic bubble memory chip, wherein the detector and the replicate are formed, to a higher magnetic field side.

The dashed line 55 indicates the strip out field 54 moved in a sense in parallel (as explained in the following) toward a higher magnetic field by the propagating patterns having a desired shape, such as the detector and the replicator, so that the magnetic bubble can propagate in a streched state at a bias field lower than that indicated by the dashed line 55. In this case, the temperature coefficient of the dashed line 55 is $0.17\%/°C$., which is smaller than that of the dashed-dotted line 54. The reason for this is that the gradient of the dashed line 55, which is formed by parallel moving of the strip out field 54 to a higher bias level by means of the propagating patterns having a desirable shape, becomes smaller than that indicated by the dash-dotted line 54, depending upon the magnetic field thereof, because the temperature coefficient is defined as a value normalized with respect to the magnetic field at a temperature of $0°$ C.

The respective lines shown in FIG. 4 are hereinafter referred to as the following:
 51—collapse field of the magnetic garnet crystal
 52—linear propagation collapse field
 53—lower limit of the bias margin
 54—strip out field of the crystal 55—stretching propagation strip out field As can be seen in FIG. 4, in the region above the linear propagation collapse field 52 (the higher magnetic field side), the magnetic bubble collapses in the minor loop section while in the detector and the replicate section it does not stretch but merely propagates or collapses. In the region between the linear propagation collapse field 52 and the stretching propagation collapse field 55, in the minor loop section, the magnetic bubble neither collapses nor strips out but propagates in a normal manner, while in the detector and the replicate sections, the magnetic bubble undesirably propagates in the non-stretched state. In the region below the lower limit of the bias margin 53 (the lower magnetic field side), in the minor loop section, the magnetic bubble strips out and effects no predetermined propagation. Therefore, in order to satisfy collectively the propagation modes of the magnetic bubble required in the respective minor loop and in the detector and replicate sections of the memory chip, the bias field shown by the slashed region between the stretching propagation strip out field 55 and the lower bias margin limit 53 must be applied to the magnetic garnet crystal film.

As is described in U.S. Pat. No. 4,002,803, for example, a process for controlling the composition of the magnetic garnet crystal film which has been developed on the basis of the finding that the propagation of the magnetic bubble in the memory chip depends upon the temperature dependence of the collapse field and the strip out field has been known in the prior art. The process disclosed in U.S. Pat. No. 4,002,803 allows the collapse field 51 of the magnetic garnet crystal to match the residual magnetization 56 of the permanent magnet. However, this process gives no consideration to the fact that the temperature coefficient of the stretching propagation strip out field 55 is smaller than that of the collapse field of the magnetic garnet crystal 51 and the strip out field of the crystal 54 with respect to the absolute value thereof. Therefore, for example when the residual magnetization 56 of the permanent magnet is set at the center of the operating region 57 shown by the slashed region at a temperature of 0° C., the residual magnetization 56 relatively approaches the lower limit of the bias margin 53 at a temperature of 100° C. so that in a higher temperature range the tendency for the magnetic bubble to strip out in the minor loop section is significant. On the other hand, if normal operation at a higher temperature is to be ensured, the possibility of the stretching of the magnetic bubble required for the detection or the replication not occurring in a lower temperature range becomes great. For these reasons, the operating temperature range (a difference between the upper operating temperature limit and the lower operating temperature limit) of the conventional magnetic bubble memory chip is only about 50° C. As the field of application of the magnetic bubble memory device has become wider, extension of the operating temperature range thereof has become necessary in the electronics field.

SUMMARY OF THE INVENTION

An object of the present invention is to remarkably increase the operating temperature range of the magnetic bubble memory chip as compared with the conventional operating temperature range.

The idea of the present invention resides in the fact that when the composition of the magnetic garnet crystal is controlled in such a manner that the temperature coefficient (absolute value) of the collapse field of the magnetic garnet crystal 51 is different from and larger than the temperature coefficient (absolute value) of the residual magnetization 56 of the permanent magnet, the temperature coefficient of the stretching propagation strip out field 55 defining the upper limit of the total operating properties required in the respective sections of the memory chip of the magnetic bubble memory device is substantially equal to the temperature coefficient of the residual magnetization 56 of the permanent magnet, whereby the operating temperature range of the memory chip is extended.

In accordance with the present invention, there is provided a magnetic bubble memory chip (hereinafter referred to as memory chip) comprising a magnetic garnet crystal film on which Permalloy patterns, such as a transfer circuit, a generation circuit, and a detector circuit, for magnetic bubbles are deposited, characterized in that the temperature coefficient ($\Delta H_0$) of the collapse field of the magnetic garnet crystal film is from 0.01° to 0.04%°C., preferably from 0.015° to 0.035%/°C., in terms of an absolute value, greater than the temperature coefficient of a permanent magnet applying a bias field to the memory chip in a direction substantially normal to the plane of the memory chip so as to stably retain the magnetic bubbles in the memory chip.

DETAILED DESCRIPTION OF THE PREFERRED EMBODIMENTS

Figure 1:
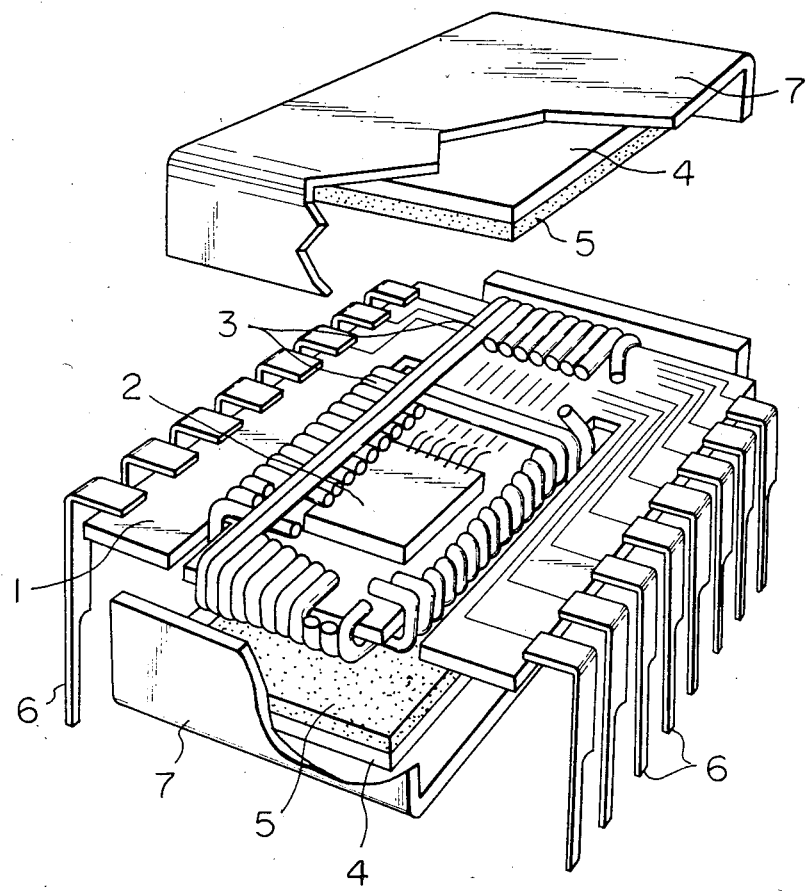
FIG. 1 is a view of an essential part of a conventional magnetic bubble memory device.

The present invention will be illustrated in detail with reference to the accompanying drawings showing the respective sections of the memory chip which are not shown in FIGS. 1 and 2.

Figure 5:
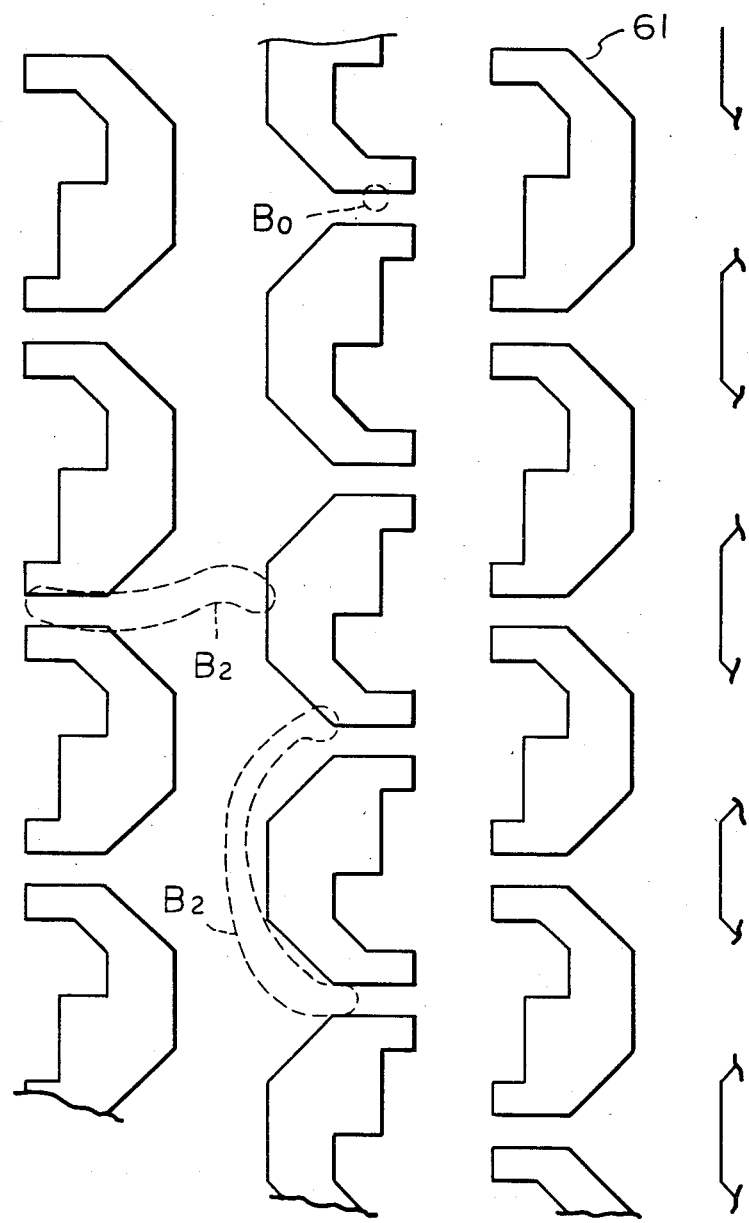
FIG. 5 is a partial view of propagating patterns consisting of Permalloy in the minor loop of the conventional magnetic bubble memory chip.

FIG. 5 shows a part of the Permalloy patterns 61 of the memory chip. The magnetic bubble is successively transferred between the Permalloy patterns 61 upward and downward in the drawing. When the field to be applied exceeds the linear propagation collapse field 52 in FIG. 4, the magnetic bubble disappears between the Permalloy patterns 61, as is shown schematically at $B_0$. On the other hand, when the bias field to be applied is lower than the lower limit of the bias margin 53 in FIG. 4, the magnetic bubble is stretched, as is schematically shown at $B_2$, and the stretched bubble becomes entangled between the adjacent Permalloy patterns, thereby resulting in an error in information. In the minor loop section, even the conventional process for controlling a temperature coefficient wherein the temperature coefficient of the permanent magnet is allowed to match the temperature coefficient ($\Delta H_0$) of the collapse field of the magnetic garnet crystal film can transfer the magnetic bubbles over an extended temperature range without causing any errors in operation.

Figure 6:
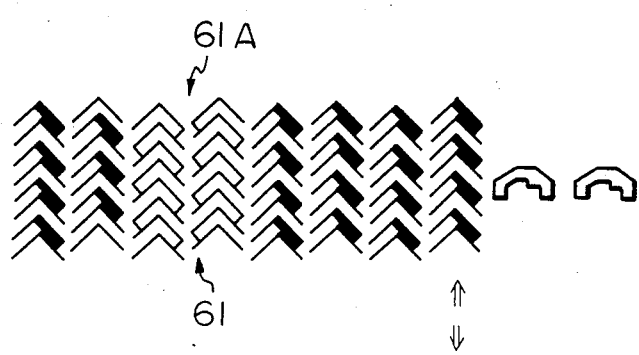
FIG. 6 is a partial view of propagating patterns of the stretcher section of the conventional magnetic bubble memory chip.

FIG. 6 shows Permalloy patterns 61 for stretching in the detector section of the memory chip. A part 61A of the conductor patterns is connected to the read-out amplifier (not shown). The magnetic bubbles are transferred from the right side to the left side. During the transfer, the magnetic bubble is stretched. In order for such stretching to take place, the Permalloy patterns 61 should be formed so that the strip out field is increased.

Figure 7:
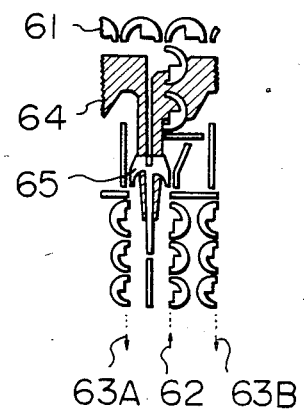
FIG. 7 is a partial view of the propagating and conductor patterns of the replicate gate of the conventional magnetic bubble memory chip.

FIG. 7 shows Permalloy patterns 65 of the replicate gate section. The magnetic bubble is first transferred in the direction indicated by the arrow 62 and is stretched by a Permalloy pattern 65 of pickax shape. The stretched magnetic bubble is divided into two portions by means of a pulse current applied to a conductor 64, one portion being transferred to a read-out circuit 61 and the other portion being returned to a memory section in the direction of 63A. Even in such a replicate gate section, it is necessary that stretching of the magnetic bubble take place.

Figure 8:
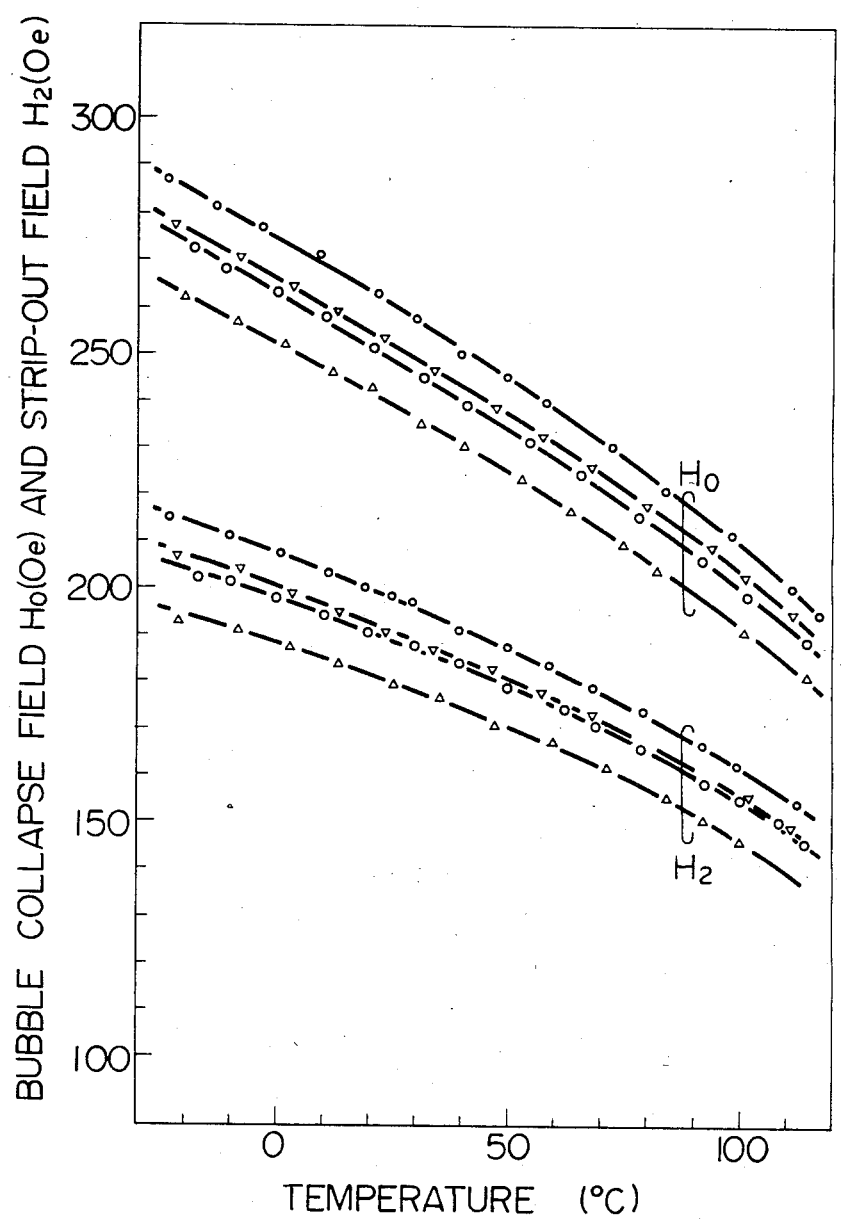
FIG. 8 is a graph illustrating a temperature dependence of the collapse field ($H_0$) and the strip out field ($H_2$) of a magnetic garnet crystal.

FIG. 8 shows a change with temperature of a collapse field $H_0$ and a strip out field $H_2$ of four types of magnetic garnet crystal film samples. The temperature coefficients ($\Delta H_0$ and $\Delta H_2$) of the $H_0$ and the $H_2$ of these samples are shown in the following table.

| Sample (plot) | Temperature coefficient (%/°C.) | |
| --- | --- | --- |
| No. | $\Delta H_0$ | $\Delta H_2$ |
| 1 ○ | −0.23 | −0.20 |
| 2 (△) | −0.23 | −0.21 |
| 3 (  ) | −0.22 | −0.20 |
| 4 (●) | −0.23 | −0.21 |

Figure 9:
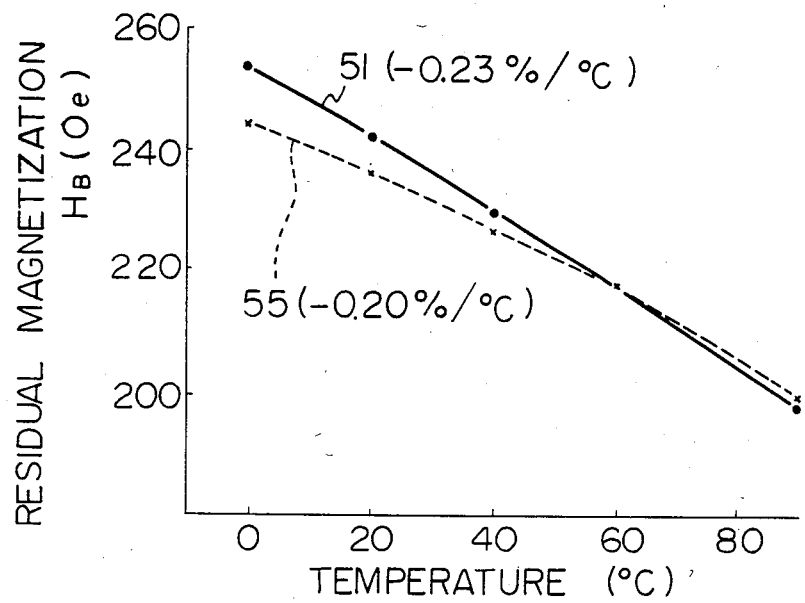
FIG. 9 is a graph illustrating a change in the temperature dependence of the collapse field ($H_0$) of the magnetic garnet crystal and a change in the temperature dependence of the upper limit of the total margin of a magnetic bubble memory chip, wherein the solid line indicates the above-mentioned $H_0$ and the dotted line indicates said upper limit of the total margin.

As is apparent from the above table, because of the relationship $|\Delta H_0| > |\Delta H_2|$, the formation of the propagating patterns causes the $|\Delta H_2|$ to be further smaller than $|\Delta H_0|$. That is, a difference between the temperature coefficient of the stretching propagatron strip out 55 and the temperature coefficient of the collapse field 51 of the magnetic garnet crystal film as shown in FIG. 4 becomes appreciable. An example is shown in FIG. 9. In this example, the temperature coefficient of the collapse field 51 of the magnetic garnet crystal film was −0.23%/°C. before the formation of the propagating patterns, but after the formation of the patterns the temperature coefficient of the stretching propagation collapse field 55 was −0.20%/°C.

Referring to FIG. 10, there is shown a graph illustrating the operating temperature range of the memory chip versus the difference between the temperature coefficients, $\Delta H_0(0°$ C.$) - \Delta H_F(0°$ C.$)$, wherein $\Delta H_F$ is the temperature coefficient of the permanent magnet. The operating temperature range of the conventional memory chip is only 50° C. In accordance with the memory chip of the present invention, an operating temperature range of from about 80° to about 120° C. can be realized. Therefore, for example, if the composition of the magnetic garnet crystal film is controlled so that $\Delta H_0 - \Delta H_F = -0.025\%/°C.$ is ensured, it is possible to select a temperature range of from −30° to +90° C., thereby allowing the memory chip to operate over a broad temperature range without causing any errors in operation.

Since the temperature coefficient $\Delta H_F(0°$ C.$)$ of the Sr or Ba ferrite used as the permanent magnet is in the range of from −0.19° to −0.20%/°C., $|\Delta H_0(0°$ C.$)| - |\Delta H_F(0°$ C.$)| = 0.01° \sim 0.04\%/°C.$ according to the present invention can be satisfied by any of the magnetic garnet crystal films shown in FIG. 8.

In accordance with the present invention, it is possible to allow the temperature coefficient of the stretching propagation strip out field 55 for stretching the magnetic bubble to match substantially and completely the temperature coefficient of the residual magnetization 56 of the permanent magnet to such a degree that the difference therebetween is ±0.015%/°C. or less. This matching is very advantageous for extending the operating temperature range of the memory chip.

In order to increase the temperature coefficient of the collapse field of the magnetic garnet crystal film 51 in FIG. 4, it is possible to utilize a process described in U.S. Pat. No. 4,002,803 wherein Fe ions in the octahedral sites in the magnetic garnet crystal are partially replaced with Lu ions. The garnet belongs to a cubic system and its composition is represented by the following formula:

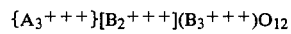

$$\{A_3^{+++}\}[B_2^{+++}](B_3^{+++})O_{12}$$

The unit lattice is composed of 24 A ions, 40 B ions and 96 O ions and { } is termed the dodecahedral site, [ ] is termed the octahedral site, and ( ) is termed the tetrahedral site. A and B ions occupy the center of the lattice point surrounded by O ions.

The sites of A and B ions in the formula of the garnet may include various ions. Garnets for the memory chip having the following formulae are suitable as the magnetic garnet crystal film:

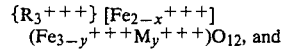

$$\{R_3^{+++}\}[Fe_{2-x}^{+++}](Fe_{3-y}^{+++}M_y^{+++})O_{12}, \text{ and}$$

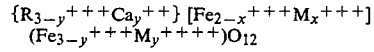

$$\{R_{3-y}^{+++}Ca_y^{++}\}[Fe_{2-x}^{+++}M_x^{+++}](Fe_{3-y}^{+++}M_y^{++++})O_{12}$$

wherein each ion is selected from for example, rare earth ions such as Y, Sm and Lu, each M ion is selected from, for example, Lu, Al and Ge.

A method for increasing the collapse field of the magnetic garnet crystal is described below with respect to a magnetic garnet having the following composition:

$$\{YSmLuCa\}_3[FeLu]_2(FeGe)_3O_{12}$$

Figure 11:
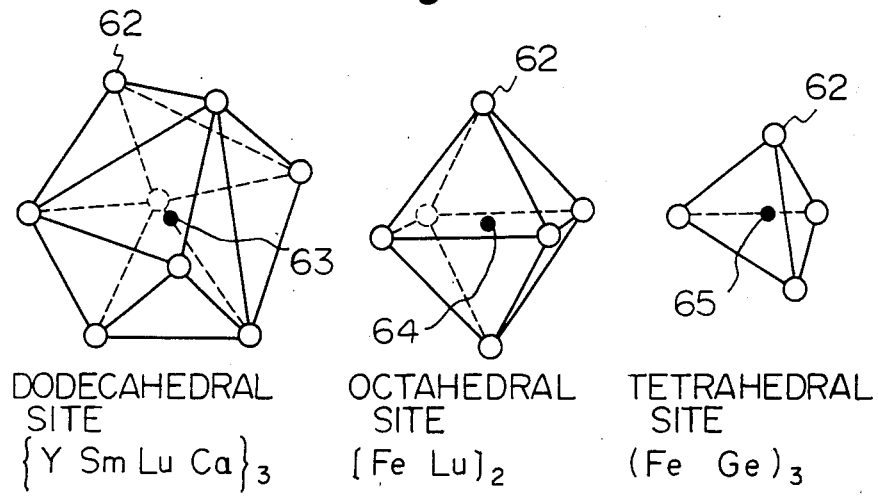
FIG. 11 is a view illustrating an arrangement of sub-lattices constituting a garnet.

FIG. 11 shows an arrangement of cations and anions which constitute sublattices of the garnet. The unit lattice can be regarded as an aggregate of crystal lattices consisting of a polyhedron composed of O ions 62, the center of which is occupied by a cation. In this case, the cations 63 occupying the dodecahedral sites are Y, Sm, Lu and Ca ions, the cations 64 occupying the octahedral sites are Fe and Lu ions, and the cations 65 occupying the tetrahedral sites are Fe and Ge ions.

In such a garnet, the saturation magnetization Ms is represented as the sum of magnetic moments due to the cations occupying the respective lattice positions.

$$M_s = m_d - m_a - m_c$$

wherein
$m_d$ ... the number of magnetic moments due to the cations occupying the tetrahedral sites
$m_a$ ... the number of magnetic moments due to the cations occupying the octahedral sites
$m_c$ ... the number of magnetic moments due to the cations occupying the dodecahedral sites The difference in signs between $m_d$, $m_a$ and $m_c$ is ascribable to the fact that in the garnet, which is composed of a ferromagnetic material called ferrimagnetism, the opposite magnetic moments constituting antiferromagnetism are different in strength from each other, whereby spontaneous magnetization due to this difference occurs.

Neglecting the saturation magnetization due to the cations 63 (in this case, each of the Y, Sm, and Lu ions) occupying the dodecahedral sites because it is small, the saturation magnetization of the garnet can be represented as the sum of the saturation magnetization due to the cations 65 (in this case, each of the Fe and Ge ions) occupying the tetrahedral sites and the saturation magnetization due to the cations 64 (in this case, each of the Fe and Lu ions) occupying the octahedral sites. That is, $$M_s = m_d - m_a$$

Figure 12:
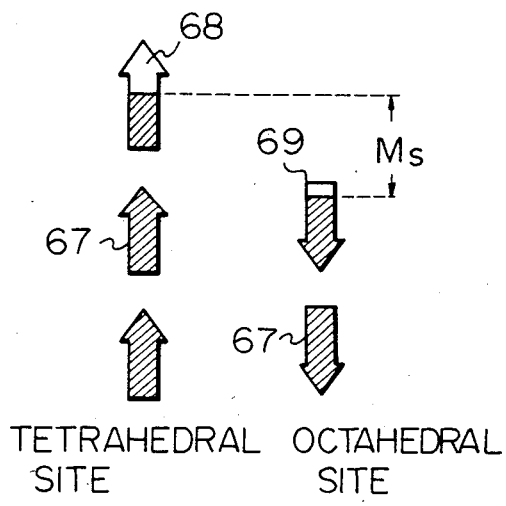
FIG. 12 is a view illustrating a saturation magnetization Ms of a magnetic garnet crystal film.

FIG. 12 diagrammatically illustrates this expression. In FIG. 12, the shadowed portions 67 represent the magnetic moment due to Fe ions while the light portions 68 and 69 represent the substitution of Ge ions and Lu ions, respectively.

Since the magnetic moment of the Fe ion is 0.5 Bohr magneton and the magnetic moments of the Ge ion and Lu ion are zero, respectively, the saturation magnetization Ms of the garnet may be regarded as the saturation magnetization due to only Fe ions, occupying the tetrahedral and octahedral sites of the ferrimagnetism having and magnetic moments opposite to each other.

The collapse field of the magnetic bubble in the magnetic garnet crystal film is proportional to the saturation magnetization Ms of the crystal as represented by the following equation:

$$H_0 = 4\pi M_s \{1.01302 + 0.68556(l/h) - 1.70787\sqrt{l/h}\}$$

wherein
  $H_0$ ... the strength of the above mentioned collapse field
  $l$ ... the characteristic length, wherein $l = \delta w / 4\pi M_s^2$, h represents the thickness of the film, and $\delta w$ represents the energy density of the magnetic wall As is apparent from FIG. 12, in order to increase the saturation magnetization of the crystal, two methods can be utilized.

One method is to partially replace Fe ions in the octahedral sites with Lu ions. In this case, the exchange interaction between the Fe ions is decreased so that the Curie temperature of the crystal is decreased, and, simultaneously, the saturation magnetization Ms and the collapse field strength $H_0$ of the magnetic garnet crystal film are increased. In addition, the temperature coefficient ($\Delta H_0$) of the above-mentioned collapse field ought to increase.

The other method is to decrease the amount of tetrahedrally substituted Ge ions for part of the Fe ions. In this case, the exchange interaction between the Fe ions is increased, with the result that the Curie temperature of the crystal is increased, and, simultaneously the Ms and the $H_0$ of the crystal are increased. In addition, the temperature coefficient of the $H_0$ ought to decrease. Thus, the degree of substitution of Lu ions in the octahedral sites of the garnet crystal was increased in the following manner.

Since Lu ions can occupy both the dodecahedral sites and the octahedral sites during the crystal growth process, the substitution of Lu ions for Fe ions in the octahedral sites is controlled by baring the total Lu ions content. In this case, the content of Lu ions per octahedral unit in the range of from 0.046 to 0.059 total relative molar concentration allows the temperature coefficient to be adjusted to around $-0.23\%/°C$. The term "total relative molar concentration" indicates the moles of Lu ions contained in the octahedral sites based on the total number of components of a unit octahedral sublattice.

Figure 13:
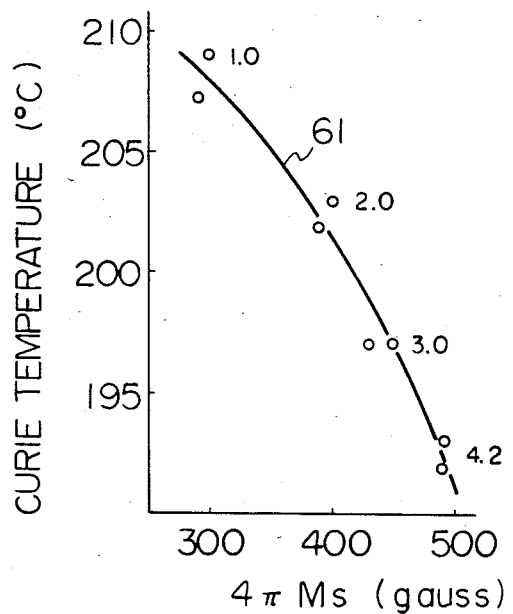
FIGS. 13 and 14 are explanatory views showing an effect of an increase in the molar melt ratio of Lu ions to Sm ions on the magnetic properties of a magnetic garnet crystal film.

FIG. 13 is a graph illustrating the relationship between the demagnetizing field $4\pi M_s$ and the Curie temperature of garnet crystal films having the composition: $\{YSmLuCa\}_3[FeLu]_2(FeGe)_3O_{12}$. The films were prepared by varying the mixing ratio of Lu ions to Sm ions. The abscissa represents the demagnetizing field $4\pi M_s$ and the ordinate represents the Curie temperature.

The reference numerals in the drawing represent the molar ratio of $Lu_2O_3$ to $Sm_2O_3$ during crystal growth of the garnet, and the circles represent the experimental results.

The curve 61 is plotted within the circles. It is apparent from this curve that as the ratio of $Lu_2O_3$ to $Sm_2O_3$ is increased, the demagnetizing field $4\pi M_s$ is increased and the Curie temperature Tc is decreased.

Figure 14:
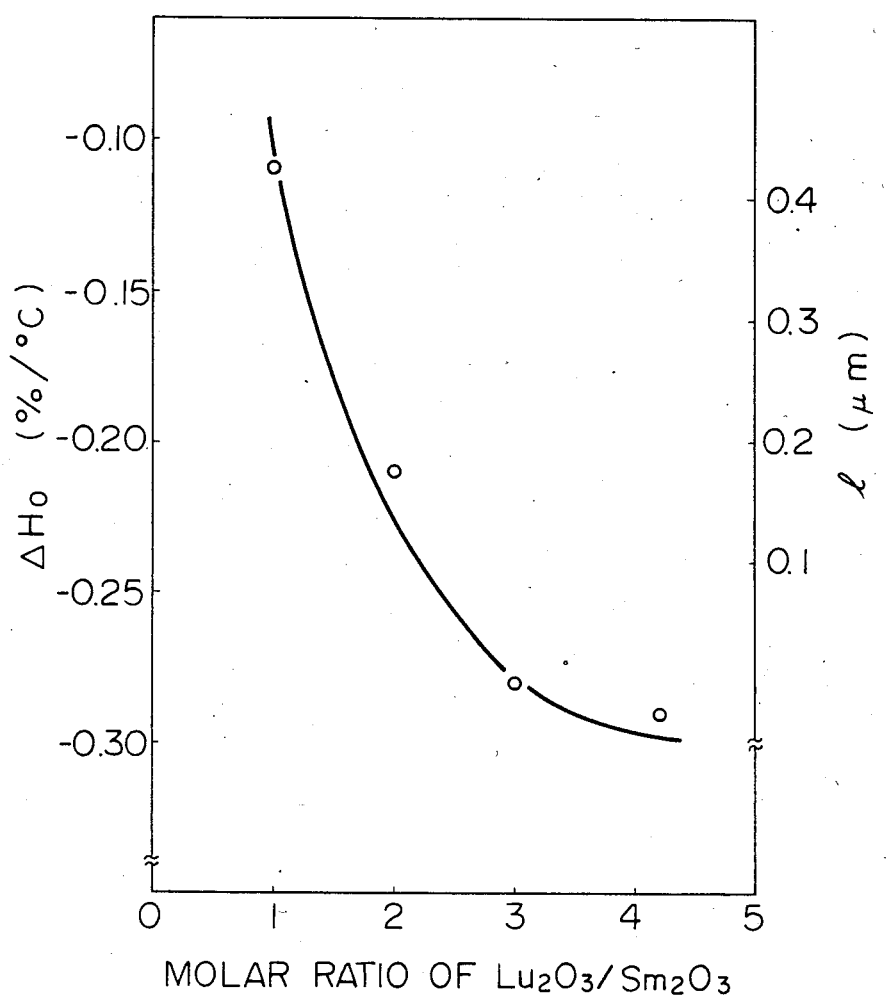

FIG. 14 is a graph showing the relationship between the molar ratio of $Lu_2O_3/Sm_2O_3$ and the temperature coefficient $\Delta H_0$ of the collapse field of the magnetic garnet crystal film. It can be confirmed from this graph that as the mixing ratio of $Lu_2O_3/Sm_2O_3$ is increased, the absolute value of $\Delta H_0$ is increased.

Next, the patterns of a transfer circuit, a generator circuit, and the like were formed on the above-prepared crystal film in order to prepare a memory chip. The operating temperature range of the memory chip was determined and found to be as shown in FIG. 10.

We claim:
1. A magnetic bubble memory chip comprising said memory chip including a garnet substrate,
  a magnetic garnet crystal film on said garnet substrate,
  propagation patterns for controlling magnetic bubbles formed on said film, wherein said bubbles are stretched during said controlling,
  a permanent magnet of Sr or Ba ferrite having a predetermined, non-zero temperature coefficient of residual magnetization, for supplying a bias field to the magnetic garnet crystal film in a direction substantially normal to the plane of the magnetic garnet crystal film,
  wherein said magnetic garnet crystal film is of a material represented by $(YSmLuCa)_3(FeLu)_2(FeGe)_3O_{12}$ and having, under the supplied bias field, a temperature coefficient of the stretching propagation strip out field that is greater in absolute value than the absolute values of the temperature coefficients of the collapse field and the strip out field of said magnetic garnet crystal film, said temperature coefficients being expressed in terms of percentage change of the strip out and collapse fields normalized with respect to the magnetic field at a temperature of 0° C.;
  wherein the temperature coefficient of the collapse field of the magnetic garnet crystal film $\Delta H_0$ is in the range from 0.01° to 0.04%/°C. less than the temperature coefficient of the residual magnetization of the permanent magnet $\Delta H_F$, and said temperature coefficient of the stretching propagation strip out field under application of said bias field through said propagation patterns shifts with said temperature coefficient of the residual magnetization of the permanent magnet, so that an operating temperature range of at least 80° C. is provided for the stable control of the magnetic bubbles during stretching.

2. The chip of claim 1, said ferrite providing a value of $\Delta H_F$ in the range from $-0.19°$ to $-0.20\%/°C$.

3. The chip of claim 3, wherein the absolute value of $\Delta H_0$ is within the range from 0.015° to 0.035%/°C. greater than the absolute value of $\Delta H_F$.

4. The chip of claim 1, wherein said operating temperature range is between the temperatures of $-30°$ to $+90°$ C.

5. The chip of claim 1, 2 or 3, comprising a detector circuit for said magnetic field, wherein the absolute value of the difference between the temperature coefficient of the residual magnetization of the permanent magnetic and the stretching propagation strip out field of said detector circuit is equal to or less than $0.015\%/°C$.

6. The chip of claim 1, 2 or 3, wherein the content of Lu ions per octahedral site is in the range from 0.046 to 0.059 total relative molar concentration.

7. The device of claim 1, wherein the temperature coefficient of the collapse field of the magnetic garnet crystal film $\Delta H_0$ has a value that is more negative than $-0.10\%/°C$.

* * * * *

UNITED STATES PATENT AND TRADEMARK OFFICE
CERTIFICATE OF CORRECTION

PATENT NO. : 4,568,618
DATED : 4 Feb. 1986
INVENTOR(S) : HIDEMA UCHISHIBA ET AL

It is certified that error appears in the above-identified patent and that said Letters Patent is hereby corrected as shown below:

Front Pate [57] ABSTRACT
    line 6, "paterns" should be --patterns--.

Col. 4, line 50, "streched" should be --stretched--;
    line 55, after "by" insert --a---.

Col. 7, line 16, "3( )" should be --3($\triangledown$)--.

Col. 8, line 17, "[$Fe_{2-x}^{+++}$]" should be --$Fe_{2-x}^{+++} M_x^{+++}$]--
    line 23, after "each" insert --R--.

Col. 9, line 16, "hav-" should be --and hav- --;
    line 17, delete "and".

Col. 10, line 66, "3," should be --2,--.

Signed and Sealed this

Tenth Day of June 1986

[SEAL]

Attest:

DONALD J. QUIGG

Attesting Officer

Commissioner of Patents and Trademarks